United States Patent
Huang et al.

(10) Patent No.: US 10,388,562 B2
(45) Date of Patent: Aug. 20, 2019

(54) COMPOSITE CONTACT ETCH STOP LAYER

(71) Applicant: GLOBALFOUNDRIES INC., Grand Cayman (KY)

(72) Inventors: Haigou Huang, Rexford, NY (US); Daniel Jaeger, Saratoga Springs, NY (US); Xusheng Wu, Ballston Lake, NY (US); Jinsheng Gao, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/678,229

(22) Filed: Aug. 16, 2017

(65) Prior Publication Data
US 2019/0057899 A1    Feb. 21, 2019

(51) Int. Cl.
| | | |
|---|---|---|
| H01L 21/336 | (2006.01) | |
| H01L 21/768 | (2006.01) | |
| H01L 29/66 | (2006.01) | |
| H01L 29/78 | (2006.01) | |
| H01L 29/08 | (2006.01) | |
| H01L 21/02 | (2006.01) | |

(52) U.S. Cl.
CPC .... *H01L 21/76832* (2013.01); *H01L 21/0217* (2013.01); *H01L 21/0228* (2013.01); *H01L 21/02164* (2013.01); *H01L 21/76831* (2013.01); *H01L 21/76895* (2013.01); *H01L 29/0847* (2013.01); *H01L 29/66545* (2013.01); *H01L 29/66636* (2013.01); *H01L 29/66795* (2013.01); *H01L 29/7851* (2013.01); *H01L 29/7848* (2013.01)

(58) Field of Classification Search
CPC .......... H01L 21/02164; H01L 21/0217; H01L 21/0228; H01L 21/76831; H01L 21/76832; H01L 21/76895; H01L 29/0847; H01L 29/66545; H01L 29/66636; H01L 29/66795; H01L 29/7851
USPC ........................................ 438/230, 283, 288
See application file for complete search history.

(56) References Cited

U.S. PATENT DOCUMENTS

2011/0129971 A1\* 6/2011 Kronholz ........ H01L 21/823807
                                                                        438/230
2012/0122283 A1   5/2012 Lee et al.
(Continued)

FOREIGN PATENT DOCUMENTS

TW             201306237 A        2/2013

OTHER PUBLICATIONS

Taiwan Office Action for Taiwanese Patent Application No. 107115740, dated Feb. 20, 2019, 24 pages.

*Primary Examiner* — Brook Kebede
(74) *Attorney, Agent, or Firm* — Anthony Canale; Hoffman Warnick LLC

(57) ABSTRACT

A composite etch stop layer includes an oxide layer formed over a sacrificial gate structure and a nitride layer formed over the oxide layer. The oxide layer is disposed over only lower portions of the sacrificial gate structure while the nitride layer envelops the oxide layer and is disposed directly over a top surface of the sacrificial gate structure. Sensitivity of the nitride layer to oxidation, such as during the formation of an interlayer dielectric over the composite etch stop layer, is decreased by eliminating the oxide layer from upper portions of the sacrificial gate layer.

18 Claims, 5 Drawing Sheets

(56) References Cited

U.S. PATENT DOCUMENTS

2012/0153398 A1* 6/2012 Baars .............. H01L 21/823412
 257/369
2014/0151762 A1* 6/2014 Wang ................ H01L 29/66477
 257/288
2016/0343858 A1* 11/2016 Kim .................... H01L 29/7848

* cited by examiner

COMPOSITE CONTACT ETCH STOP LAYER

BACKGROUND

The present application relates generally to semiconductor devices, and more specifically to transistors such as field effect transistors and their methods of production.

The fabrication of semiconductor devices such as field effect transistors (FETs) typically involves multiple steps of layer deposition, patterning, and etching to define various structures on a substrate. Integration schemes using spacer and cap layers, for example, may be used to minimize leakage between conductive structures such as a gate and a contact and thereby produce higher quality devices.

SUMMARY

In accordance with embodiments of the present application, a method of fabricating a semiconductor device includes forming a sacrificial gate structure over a semiconductor substrate. The sacrificial gate structure includes a sacrificial gate and a sacrificial gate gap formed over the sacrificial gate. The method further includes forming a sidewall spacer layer over sidewalls of the sacrificial gate structure, and forming a first etch stop layer over the sidewall spacer layer laterally adjacent to the sacrificial gate. A second etch stop layer is formed over the first etch stop layer and directly over the sacrificial gate cap.

According to a further method, plural of sacrificial gate structures are formed over a semiconductor substrate. A sidewall spacer layer is formed over sidewalls of the sacrificial gate structures, and a first etch stop layer is formed over the sidewall spacer layer and over a top surface of the sacrificial gate caps. A hard mask is then formed over the first etch stop layer, and the hard mask is etched to expose the first etch stop layer over the top surface of the sacrificial gate caps and recess the hard mask between adjacent sacrificial gate structures.

Exposed portions of the first etch stop layer are removed from over the top surfaces of the sacrificial gate caps and from over surfaces of the sidewall spacer layer laterally adjacent to the sacrificial gate caps. Then, remaining portions of the hard mask are removed from between the adjacent sacrificial gate structures and a second etch stop layer is formed over the first etch stop layer and directly over the sacrificial gate caps.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 3:
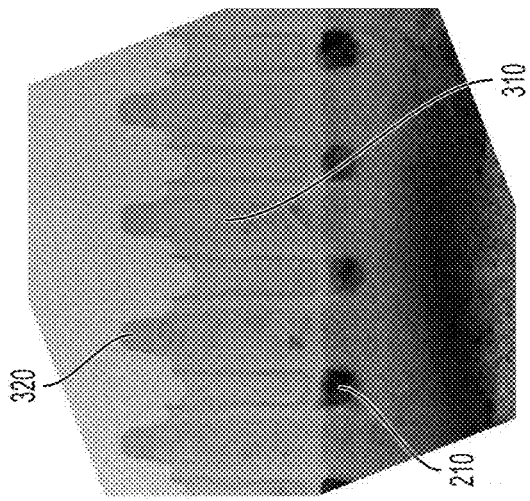
FIG. 3 is a transmission electron microscope (TEM) micrograph of the comparative structure of FIG. 2 showing a recess etch of the dielectric material between adjacent sacrificial gate structures including etching of the oxide sub-layer and the attendant exposure of upper portions of the sacrificial gate.

Reference will now be made in greater detail to various embodiments of the subject matter of the present application, some embodiments of which are illustrated in the accompanying drawings. The same reference numerals will be used throughout the drawings to refer to the same or similar parts.

Disclosed in various embodiments is a method of manufacturing a semiconductor device such as a fin field effect transistor (FinFET) device having an improved contact etch stop layer. The disclosed method may be implemented in conjunction with a gate last, or replacement metal gate (RMG) process. A typical process flow for manufacturing replacement metal gate (RMG) transistors includes forming a temporary or sacrificial gate, forming additional transistor structures, and then removing the sacrificial gate leaving a trench where various layers of material (e.g., gate dielectric and gate conductor materials) are deposited to form the functional gate. This approach delays gate formation until after processing that may otherwise damage the gate materials, such as exposure to elevated temperatures and/or ion implantation. As used herein, a "functional gate" refers to a structure used to control output current (i.e., the flow of carriers through a channel) of a semiconductor device using an electrical field or, in some instances, a magnetic field, and includes a gate dielectric and a gate conductor.

According to various embodiments, the method involves forming a composite contact etch stop layer (CESL) over a sacrificial gate structure (i.e., sacrificial gate and sacrificial gate cap) and over source/drain junctions. The composite contact etch stop layer, which is adapted to protect various device features during one or more etching steps, includes both an oxide layer and an overlying nitride layer. In particular, the CESL is adapted to confine etching to particular regions (e.g., between adjacent gate structures) during a contact etch process. The CESL should have good etch resistance to the chemistry that is later used to etch the region where a contact is to be formed.

In various embodiments, the composite contact etch stop layer (CESL) is formed such that the oxide layer is omitted from over upper portions of the sacrificial gate structure, whereas the nitride layer is formed over upper portions of the sacrificial gate structure and directly over the sacrificial gate cap. Applicant has found that such a composite contact etch stop layer, where the underlying oxide layer is interrupted in the upper region of the sacrificial gate structure, exhibits improved mechanical integrity relative to a continuous oxide/nitride composite etch stop layer, and inhibits undesired erosion of the sacrificial gate during subsequent processing.

Figure 1:
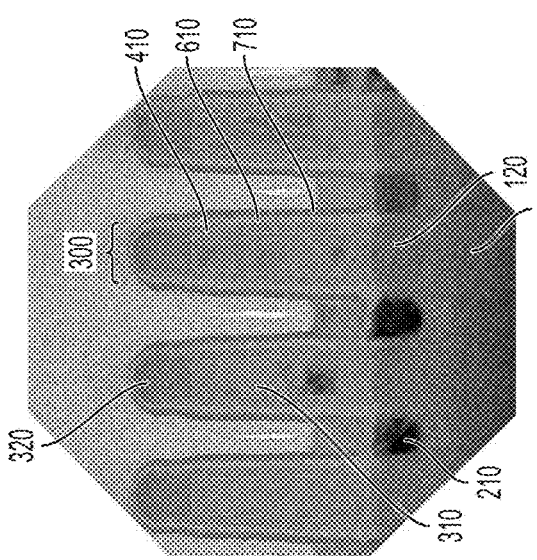
FIG. 1 is a transmission electron microscope (TEM) micrograph of a comparative structure showing a composite contact etch stop layer including oxide and nitride sub-layers disposed over a sacrificial gate structure prior to filling the gap between adjacent sacrificial gate structures with a dielectric material.

Referring to FIG. 1, a transmission electron microscope (TEM) micrograph shows a comparative device architecture including a plurality of sacrificial gate structures 300 disposed over a semiconductor substrate 100. The semiconductor substrate 100 may be a bulk substrate or a composite substrate such as a semiconductor-on-insulator (SOI) substrate. For instance, semiconductor substrate 100 may comprise a semiconductor material such as silicon (Si) or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multilayers thereof. The semiconductor substrate 100 is not limited to silicon-containing materials, however, as the substrate 100 may comprise other semiconductor materials, including Ge and compound semiconductors such as GaAs, InAs and other like semiconductors. Portions of the semiconductor substrate 100 may be amorphous, polycrystalline, or single crystalline.

In various embodiments, the device may comprise a fin field effect transistor (FinFET). In such embodiments, one or more semiconductor tins 120 may be formed by patterning and etching the semiconductor layer of an SOI substrate or a top portion of a bulk semiconductor substrate. The etching process typically comprises an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

By way of example, the fins 120 may be formed using a sidewall image transfer (SIT) process, which includes formation of a spacer material on sidewall surfaces of a mandrel. The spacer includes a material that has a different etch selectivity than the mandrel such that, after spacer formation, the mandrel is removed by etching. Each spacer is then used as a hard mask during a subsequent etching process that defines the fins.

The semiconductor fins 120 are typically arranged in parallel and are laterally isolated from each other by a shallow trench isolation layer (not shown). Raised source/drain junctions 210 are disposed over portions of the fins 120 (i.e., source and drain regions) proximate to top surfaces thereof. As known to those skilled in the art, source/drain junctions 210 may be formed by ion implantation or selective epitaxy, optionally using the sacrificial gate structures 300 as an alignment mask. For instance, according to various embodiments, source/drain junctions 210 are formed by selective epitaxy into self-aligned cavities that are defined over the fins between the sacrificial gate structures. That is, source/drain junctions 210 are formed over source and drain regions of the fins 120 on either side of a channel region, which underlies the sacrificial gate structure 300.

Source/drain junctions 210 may comprise silicon (e.g., Si) or a silicon-containing material such as silicon germanium (SiGe). For instance, SiGe source/drain junctions may be incorporated into a p-MOS device to provide compressive stress to the channel, which can improve carrier mobility.

The plural sacrificial gate structures 300 straddle the fins, i.e., over channel regions of the fins between source/drain junctions 210. The sacrificial gate structures 300 each include a sacrificial gate 310 and a sacrificial gate cap 320 formed over the sacrificial gate 310. Sacrificial gate 310 may include amorphous or polycrystalline silicon, and sacrificial gate cap 320 may include a nitride layer such as silicon nitride.

In the illustrated structure of FIG. 1, sidewalls spacers 410 are disposed over sidewalls (vertical surfaces) of the sacrificial gate structures 300. Sidewall spacers 410 may be formed by blanket deposition of a spacer material (e.g., using atomic layer deposition) followed by a directional etch such as reactive ion etching (RIE) to remove the spacer material from horizontal surfaces. Suitable sidewall materials include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. As used herein, a low-k material has a dielectric constant less than that of silicon dioxide. In certain embodiments, the sidewall spacer 410 thickness is 4 to 20 nm, e.g., 4, 10, 15 or 20 nm, including ranges between any of the foregoing values.

A conformal composite liner 610, 710 is disposed over the sidewall spacers 410 as well as over a top surface of the source/drain junctions 210. The composite liner 610, 710 is adapted to function as a contact etch stop layer (CESL). The composite liner includes an oxide layer 610 and a nitride layer 710 overlying the oxide layer 610.

As described herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

The incorporation of an oxide layer 610 beneath the nitride layer 710 may simplify later removal of the nitride layer 710, thus advantageously increasing the size of the contact opening space between adjacent gates. Specifically, nitride materials may be etched selectively with respect to oxide materials. Thus, the oxide layer 610 may itself function as an etch stop layer during removal of the nitride layer 710, while effectively protecting underlying structures such as the epitaxial source/drain junction 210 and/or the sacrificial gate 310, which may otherwise be etched by the chemistry used to removal the nitride layer 710.

The respective sub-layers 610, 710 of the conformal liner may be formed by blanket deposition of silicon dioxide and silicon nitride using atomic layer deposition. As seen with reference to FIG. 1, within the source/drain contact locations the conformal liner is formed over the sidewall spacers 410 as well as over the source/drain junctions 210. In certain embodiments, the thickness of the oxide and nitride layers may independently range from 2 to 6 nm, e.g., 2, 4, or 6 nm, including ranges between any of the foregoing values, and the total conformal liner thickness may be 4 to 12 nm, e.g., 4, 6, 8, 10 or 12 nm, including ranges between any of the foregoing values, although lesser and greater thicknesses are contemplated.

In various embodiments, the sidewall spacers 410 and the composite conformal liner 610, 710 are formed from materials that can be etched selectively to one another. In particular embodiments, the sidewall spacers 410 comprises SiOCN and the conformal liner (i.e., contact etch stop layer) comprises a first etch stop layer 610 of silicon dioxide and a second etch stop layer 710 of silicon nitride.

As will be appreciated, the compounds silicon dioxide and silicon nitride have compositions that are nominally represented as $SiO_2$, and $Si_3N_4$, respectively. The terms silicon dioxide and silicon nitride, refer to not only these stoichiometric compositions, but also to oxide and nitride compositions that deviate from the stoichiometric compositions.

Figure 2:
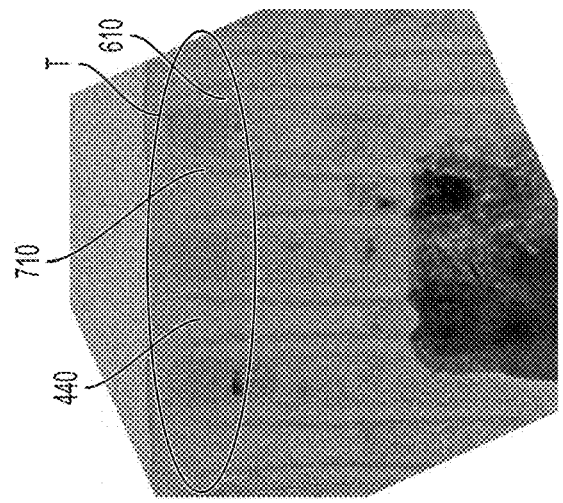
FIG. 2 is a transmission electron microscope (TEM) micrograph of the comparative structure of FIG. 1 showing breakdown of the nitride sub-layer following an oxidation anneal of the dielectric material deposited into the gap between the adjacent sacrificial gate structures.

Referring to FIG. 2, one or more layers of an interlayer dielectric 440 are disposed over the fins, i.e., within gaps 800 between adjacent sacrificial gate structure 300 and over source/drain junctions 210. Interlayer dielectric 440 is formed directly over the composite liner 610, 710 and may comprise a flowable silicon dioxide, for example. Silicon dioxide deposited using a high density plasma (HDP) or a flowable silicon dioxide may be used to fill (e.g., completely fill) the high aspect ratio gaps 800.

HDP oxide is typically deposited by high density plasma chemical vapor deposition (HDP-CVD) under oxidizing conditions from a suitable silicon-containing precursor. In various methods, a flowable silicon dioxide is deposited using one or more silicon-containing precursors and an oxidizing gas. Example silicon precursor materials include, but are not limited to, alkoxysilanes, e.g., tetraoxymethyl-cyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol. Example oxidizing gases include, but are not limited to, ozone, hydrogen peroxide, oxygen, water (steam), and alcohols, such as methanol, ethanol, and isopropanol.

During and/or subsequent to deposition of the flowable material, a portion or all of the deposited layer 440 may be densified using, for example, a cure/anneal process. According to various embodiments, a cure/anneal process involves exposure to a steam, thermal, ultraviolet (UV), electron-beam (e-beam), microwave, laser or plasma source in an oxidative or inert environment.

It has been observed that the oxidizing conditions associated with deposition and/or densification of the interlayer dielectric 440 may adversely affect nitride layer 710, resulting in a breakdown in the etch resistance of the CESL layer. Referring still to FIG. 2, following deposition of ILD 400 and a steam-based densification step, nitride layer 710 has been oxidized and buckled within a top region (T) of the structure, i.e., proximate to a top surface of the structure. Without wishing to be bound by theory, the overlying interlayer dielectric 440 and the underlying oxide layer 610 provide complementary diffusion paths for oxidizing species such as molecular or atomic oxygen to react with and oxidize the intervening nitride layer 710. The decreased contrast between the nitride layer 710 and the adjacent oxide layers 400, 610 in FIG. 2 suggests partial or complete oxidation of the nitride layer 710, e.g., to form a silicon oxynitride or silicon dioxide layer.

Referring to FIG. 3, a transmission electron microscope (TEM) micrograph of the comparative structure of FIG. 2 shows the effect of a subsequent recess etch of the interlayer dielectric 440 between adjacent sacrificial gate structures 300. Notably, breakdown of the nitride layer 710 may result in etching of the oxide layer 610 and the attendant exposure of upper portions of the sacrificial gate 310. Damage to the sacrificial gate 310 due to failure of the CESL 610, 710 may result in an electrical short between adjacent contacts, e.g., between a later-formed source/drain contact within gap 800 and gate contacts.

A method of forming an improved CESL architecture is described with reference to FIGS. 4-8. According to various embodiments, provided is a composite CESL layer where the oxide layer 610 is removed from upper regions of the sacrificial gate structure prior to formation of the nitride layer 710. This revised architecture eliminates the ingress path of oxidizing species, which effectively disrupts the mechanism responsible for oxidation of the nitride layer 710.

Figure 4:
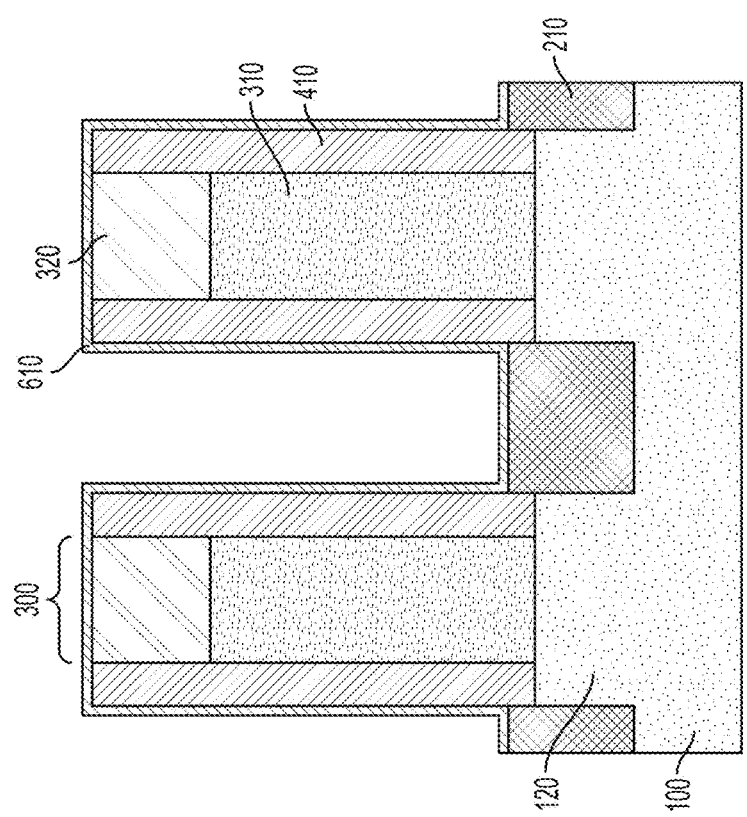
FIG. 4 is a cross-sectional schematic view of a device architecture showing deposition of an oxide layer over a sacrificial gate structure according to various embodiments.

Referring to FIG. 4, a cross-sectional schematic view depicts the deposition of a conformal oxide layer 610 over a sacrificial gate structure 300. As illustrated, the oxide layer 610 is formed directly over source/drain junctions 210 between adjacent sacrificial gate structure 300, directly over sidewalls spacers 410, and extends over sacrificial gate cap 320.

Figure 5:
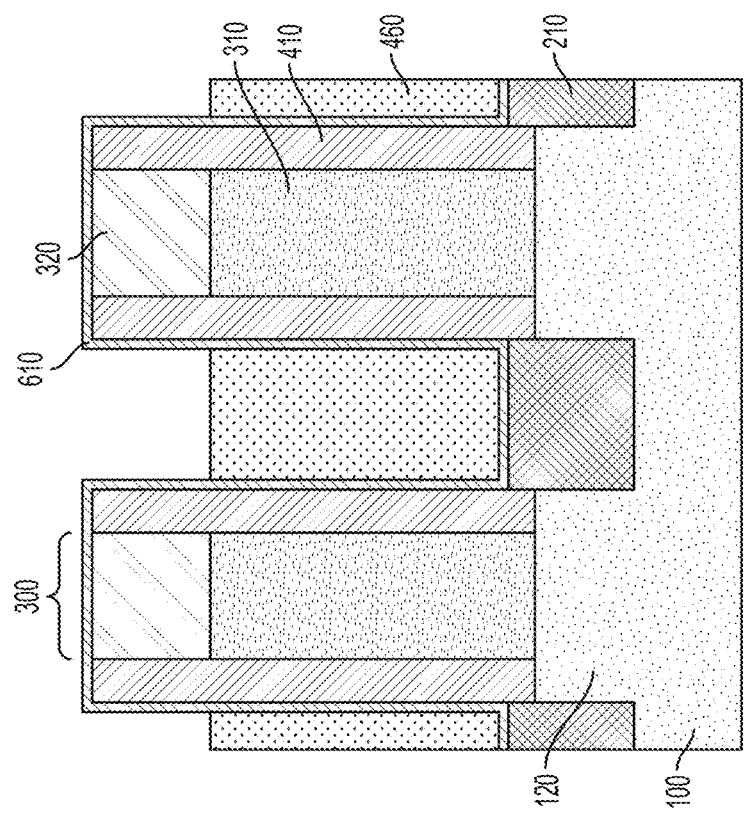
FIG. 5 is a cross-sectional schematic view of the device architecture of FIG. 4 following the deposition and recess etch of a hard mask between adjacent sacrificial gate structures and over the oxide layer.

FIG. 5 shows a corresponding cross-sectional schematic view following the deposition and recess etch of a hard mask 460 between adjacent sacrificial gate structures 300. In certain embodiments, the hard mask 460 is recessed to expose the oxide layer 610 laterally adjacent to the sacrificial gate cap 320, i.e., the entire oxide layer 610 laterally adjacent to the sacrificial gate cap 320 is exposed such that the height of the recessed hard mask 460 is at or below the height of the sacrificial gate 310.

In various embodiments, the hard mask 460 is a spin-on hard mask, and may comprise amorphous carbon, SiC, or SiCN, as examples. Prior to the recess etch, the hard mask may be planarized. "Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Following the recess etch of the hard mask 460, portions of the oxide layer 610 are exposed. In various embodiments, the recess etch of the hard mask 460 exposes the oxide layer over top portions of the sacrificial gate structure 300, including the oxide layer 610 disposed directly over sacrificial gate cap 320.

Figure 6:
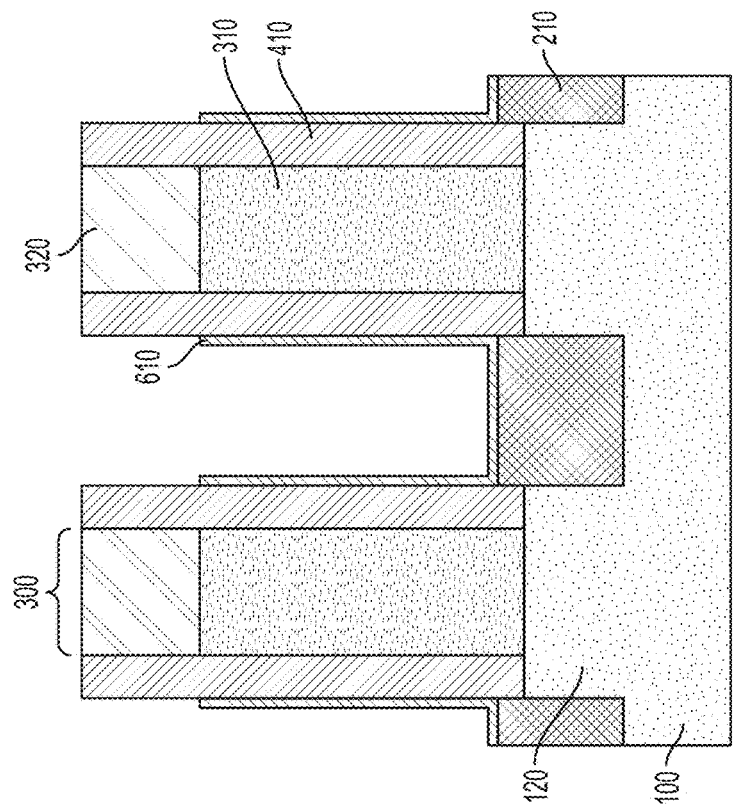
FIG. 6 shows removal of the exposed oxide layer from over upper portions of the sacrificial gate structures.

Referring to FIG. 6, shown is the selective removal of the exposed oxide layer 610 from over upper portions of the sacrificial gate structure 300. In the illustrated embodiment, a top surface of the oxide layer 610 is coplanar with a top surface of the sacrificial gate 310.

Figure 7:
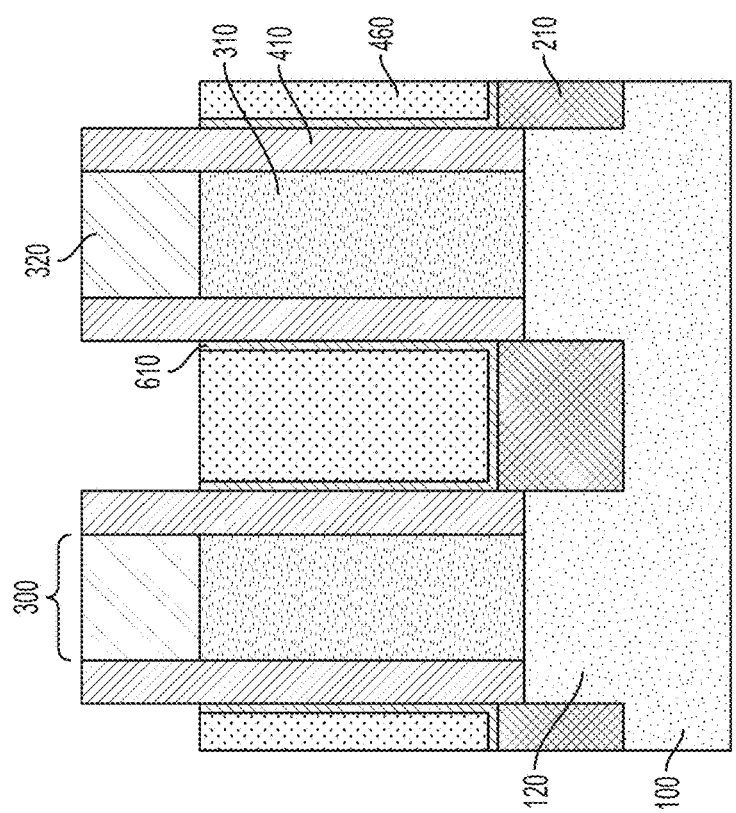
FIG. 7 depicts the structure of FIG. 6 following removal of remaining portions of the hard mask.
Figure 8:
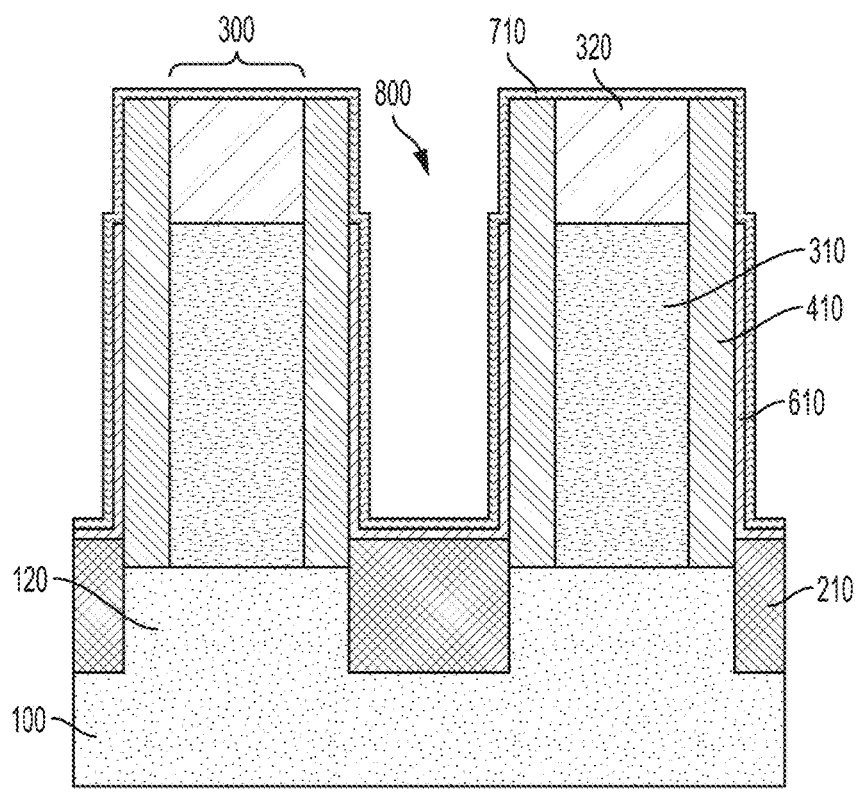
FIG. 8 shows deposition of a nitride layer over remaining portions of the oxide layer and over upper portions of the sacrificial gate structures.

FIG. 7 depicts the structure of FIG. 6 following removal of remaining portions of the hard mask. Referring to FIG. 8, shown is the deposition of a nitride layer 710 over remaining portions of the oxide layer 610 and over upper portions of the sacrificial gate structure 300. In the illustrated embodiment, the nitride layer 710 is formed directly over the sidewall spacer layer 410 laterally adjacent to the sacrificial gate cap 320. Notably, the nitride layer 710 is formed directly over the oxide layer 610 laterally adjacent to the sacrificial gate 310 and directly over the sidewall spacer layer 410 laterally adjacent to the sacrificial gate cap 320.

Figure 9:
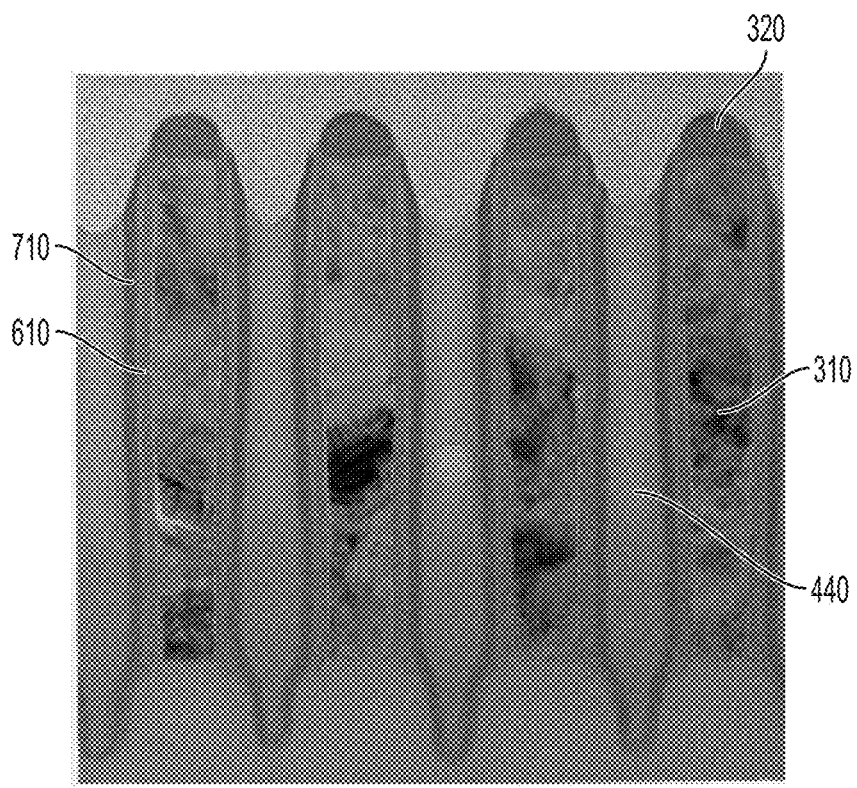
FIG. 9 is a transmission electron microscope (TEM) micrograph showing a recess etch of the interlayer dielectric between adjacent sacrificial gate structures including retention of the oxide and nitride layers over upper portions of the sacrificial gate structures.

Referring to FIG. 9, a transmission electron microscope (TEM) micrograph shows a structure following a recess etch of the interlayer dielectric 440 between adjacent sacrificial gate structures 300 including retention of the oxide and nitride layers 610, 710 over upper portions of the sacrificial gates 310. By maintaining the etch stop properties of the nitride layer 710, the composite CESL, 610, 710 can protect the polysilicon gate from unwanted etching or erosion during downstream processing.

The disclosed method provides a composite contact etch stop layer (CESL) architecture. Devices fabricated using the contact etch stop layer architecture have a decreased propensity for sacrificial gate erosion and fewer incidences of inter-contact electrical short circuits. Integrated circuits fabricated using the instant method have improved reliability and performance, with minimal leakage between gate and source/drain contacts, and decreased instances of circuit failure.

As used herein, the singular forms "a," "an" and "the" include plural referents unless the context clearly dictates otherwise. Thus, for example, reference to a "sacrificial gate structure" includes examples having two or more such "sacrificial gate structures" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a contact etch stop layer that comprises silicon dioxide and silicon nitride include embodiments where a contact etch stop layer consists essentially of silicon dioxide and silicon nitride and embodiments where a contact etch stop layer consists of silicon dioxide and silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of fabricating a device, comprising:
    forming a sacrificial gate structure over a semiconductor substrate, wherein the sacrificial gate structure includes a sacrificial gate and a sacrificial gate cap formed over a top surface of the sacrificial gate;
    forming a sidewall spacer layer over sidewalls of the sacrificial gate structure;
    forming a first etch stop layer over the sidewall spacer layer laterally adjacent to the sacrificial gate;
    removing portions of the first etch stop layer from over a top surface of the sacrificial gate cap and from over surfaces of the sidewall spacer layer laterally adjacent to the sacrificial gate cap; and
    forming a second etch stop layer over the first etch stop layer, the surfaces of the sidewall spacer layer laterally adjacent to the sacrificial gate cap, and the sacrificial gate cap, wherein the second etch stop layer is formed directly on the sacrificial gate cap and the surfaces of the sidewall spacer layer laterally adjacent to the sacrificial gate cap without intervening layers.

2. The method of claim 1, wherein the first and second etch stop layers are formed by atomic layer deposition.

3. The method of claim 1, wherein the first etch stop layer comprises silicon dioxide and the second etch stop layer comprises silicon nitride.

4. The method of claim 1, wherein a top surface of the first etch stop layer is coplanar with the top surface of the sacrificial gate.

5. The method of claim 1, wherein the second etch stop layer is formed directly over the first etch stop layer laterally adjacent to the sacrificial gate.

6. The method of claim 1, wherein forming the sacrificial gate structure comprises forming a plurality of sacrificial gate structures over the semiconductor substrate.

7. The method of claim 6, further comprising forming a source/drain junction over the semiconductor substrate between adjacent sacrificial gate structures.

8. The method of claim 7, wherein the first etch stop layer is formed directly over the source/drain junction.

9. A method of fabricating a device, comprising:
    forming a plurality of sacrificial gate structures over a semiconductor substrate, wherein the sacrificial gate structures each include a sacrificial gate and a sacrificial gate cap formed over a top surface of the sacrificial gate;
    forming a sidewall spacer layer over sidewalls of the sacrificial gate structures;
    forming a first etch stop layer over the sidewall spacer layer and over a top surface of the sacrificial gate caps;
    forming a hard mask over the first etch stop layer;
    etching the hard mask to expose the first etch stop layer over the top surface of the sacrificial gate caps and recess the hard mask between adjacent sacrificial gate structures;
    removing exposed portions of the first etch stop layer from over the top surface of the sacrificial gate caps and from over surfaces of the sidewall spacer layer laterally adjacent to the sacrificial gate caps;
    removing remaining portions of the hard mask from between the adjacent sacrificial gate structures; and
    forming a second etch stop layer over the first etch stop layer and directly over the sacrificial gate caps.

10. The method of claim 9, wherein the first etch stop layer comprises silicon dioxide and the second etch stop layer comprises silicon nitride.

11. The method of claim 9, wherein the hard mask comprises a spin on hard mask.

12. The method of claim 9, further comprising planarizing the hard mask prior to recessing the hard mask between the adjacent sacrificial gate structures.

13. The method of claim 9, wherein a top surface of the first etch stop layer is coplanar with the top surface of the sacrificial gate.

14. The method of claim 9, wherein the second etch stop layer is formed directly over the sidewall spacer layer laterally adjacent to the sacrificial gate caps.

15. The method of claim 9, wherein the second etch stop layer is formed directly over the first etch stop layer laterally adjacent to the sacrificial gate and directly over the sidewall spacer layer laterally adjacent to the sacrificial gate caps.

16. The method of claim 9, further comprising forming a source/drain junction over the semiconductor substrate between the adjacent sacrificial gate structures.

17. The method of claim 16, wherein the first etch stop layer is formed directly over the source/drain junction.

18. The method of claim 9, further comprising a plurality of fins from the semiconductor substrate and forming the plurality of sacrificial gate structures over the plurality of fins.

* * * * *